(12) United States Patent
Usami

(10) Patent No.: US 6,635,968 B2
(45) Date of Patent: Oct. 21, 2003

(54) SEMICONDUCTOR DEVICE HAVING IMPROVED ALIGNMENT OF AN ELECTRODE TERMINAL ON A SEMICONDUCTOR CHIP AND A CONDUCTOR COUPLED TO THE ELECTRODE TERMINAL

(75) Inventor: Mitsuo Usami, Tachikawa (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/775,546

(22) Filed: Feb. 5, 2001

(65) Prior Publication Data

US 2001/0012645 A1 Aug. 9, 2001

(30) Foreign Application Priority Data

Feb. 4, 2000 (JP) .......................... 2000-032737

(51) Int. Cl.7 .................. H01L 23/48; H01L 23/52; H01L 29/40; H01L 21/4763; H01L 21/44
(52) U.S. Cl. .................. 257/773; 257/688; 257/692; 438/618; 438/666; 438/928
(58) Field of Search ................. 257/773, 688, 257/692; 438/666, 618, 928

(56) References Cited

U.S. PATENT DOCUMENTS

| 4,709,253 A | * 11/1987 | Walters ................ 357/68 |
| 4,731,643 A | * 3/1988 | Dunham et al. ........ 357/68 |
| 5,721,452 A | * 2/1998 | Fogal et al. .......... 257/685 |

FOREIGN PATENT DOCUMENTS

EP  0465253 A2 * 8/1992 ......... H01L/23/498

OTHER PUBLICATIONS

Japanese Patent Application No. 08–316194.
* cited by examiner

*Primary Examiner*—Carl Whitehead, Jr.
*Assistant Examiner*—Nema Berezny
(74) *Attorney, Agent, or Firm*—Antonelli, Terry, Stout & Kraus, LLP

(57) ABSTRACT

A semiconductor device manufacturing method is used for packaging a thin semiconductor chip in an economical manner. A semiconductor chip having one electrode terminal, a first member having a first conductor on its surface, and a second member having a second conductor on its surface are prepared. The first and second members are positioned such that the first and second conductors face each other, and the semiconductor chip is held between the members. In this arrangement, one of the first and second conductors is in electrical contact with the first electrode.

7 Claims, 14 Drawing Sheets

SEMICONDUCTOR DEVICE HAVING IMPROVED ALIGNMENT OF AN ELECTRODE TERMINAL ON A SEMICONDUCTOR CHIP AND A CONDUCTOR COUPLED TO THE ELECTRODE TERMINAL

BACKGROUND OF THE INVENTION

The present invention relates to a semiconductor device and its method of manufacture. The invention is preferably applicable to a non-contact type identification device particularly utilizing a thin semiconductor chip.

Japanese Published Unexamined Patent Application No. Hei 8–316194 discloses a conventional way of assembling a thin semiconductor chip. This conventional method will be described with reference to FIGS. 1(a) to 1(d). FIG. 1(a) is a cross-sectional view showing a tape 53 having an adhesive layer 52, to which semiconductor chips 54 with adhesive 45 are attached. FIG. 1(b) is a cross-sectional view of the tape 53, following the state shown in FIG. 1(a), wherein a tape 63 having an adhesive layer 62 is attached to the semiconductor chips 54, and the tape 53 is irradiated with ultraviolet light 61 so as to release the semiconductor chips 54 therefrom. FIG. 1(c) is a cross-sectional view of the sheet 63 to which the semiconductor chips have been transferred in the operation illustrated in FIG. 1(b). The sheet is turned over. A semiconductor chip 54 is aligned with an electrode 11 on a film substrate 23, and a heating head 64 is pressed against the sheet to heat the adhesive which holds the chip on the tape 63. FIG. 1(d) is a cross-sectional view of the film substrate 23, after the adhesive 45 on the semiconductor chip has been melted, showing the semiconductor chip attached to the electrode 11.

SUMMARY OF THE INVENTION

As shown in FIGS. 1A to 1D, generally, in the thin semiconductor chip assembly, the chips are attached to a tape for handling and alignment of the chips. In a case where the thin semiconductor chips are separately handled, since the separated chips can be non-uniformly placed on their front/rear surfaces, the assembly is very difficult. Further, since the chips are thin, there is a probability of damage to the chips when they hit something upon handling, with the result that there may be a loss of a chip corner or the like. The damaged chip become a defective chip.

Since the rate of excellent chips decreases in the proportion to the amount of defects, the chip yield is reduced. Accordingly, generally, handling and alignment of chips are performed by the method as shown in FIGS. 1A to 1D. Since handling after the chips are separated causes the production yield to be deteriorated, such handling is not performed on a mass-production basis.

The object of the present invention is to reduce the number of process steps in a manufacturing method to a smaller number of steps than the number of steps in the conventional thin-semiconductor chip handling and alignment method as shown in FIG. 6.

Further, another object of the present invention is to simplify the attachment apparatus necessary for the thin-semiconductor chip handling and alignment.

In accordance with the present invention, an alignment jig 401, as shown in FIG. 2A, is prepared. The jig 401 has single or plural grooves, openings or holes (hereinbelow, holes) 402, and alignment of identification chips 12 is accomplished by inserting the identification chips 12 into the holes 402 of the jig 401. Preferably, the identification chips have a rectangular or square plane shape. The holes 402 have a size somewhat larger than the plane size of the identification chips. The identification chips 12 are attached to a film substrate 403, as shown in FIG. 2B, provided under the jig. One surface of each aligned identification chip 12 adheres to the film substrate 403.

In this state, a pair of electrode pads are provided on each identification chip 12, and radiation antennas 404 are attached, in the form of wings, to the pads. It is preferable that the electrode pads are provided approximately symmetrically with respect to the center of the identification chip 12. In this arrangement, in a case where the identification chip 12 is rotated 90° in the hole 402 and aligned, or in a case where the identification chip 12 is aligned without such rotation, electrical connection is established between the antennas and the electrodes.

FIGS. 3A and 3B show examples where the electrodes of the identification chip 12 are provided approximately symmetrically with respect to, not the central point, but a central axis. Here the same advantage as that in FIG. 2A can be obtained. In addition to the examples in FIGS. 2A, 2B, 3A and 3B, in any cases of alignment where the electrodes are aligned in not unique, but plural ways, it is necessary to define the positions and the shape of the electrodes, the position and the shape of the antenna, and the like, such that the antennas can be properly positioned on the electrodes.

Further, the identification chip 12 might be turned over before alignment. In such case, the antennas must be properly aligned with the electrodes and electrically connected to the electrodes. FIGS. 4A and 4B show constructions for this purpose, where two antennas are provided so as to hold the identification chip therebetween. For example, antennas 71 and 75 hold the identification-chip 12 between them (FIGS. 4A and 4B shows these antennas, overlapped with each other, like a single antenna). One of the antennas is electrically connected to the electrode of the identification chip 12. That is, only one antenna connected to the electrode performs its function. In FIGS. 4A and 4B in a case where the identification chip 12 is rotated 0° or 90° before alignment, or in a case where the identification chip 12 is turned over or is not turned over electrical connection still can be established between the electrodes and the antennas.

The constructions for the above purpose are as follows.

1. A semiconductor device where the front and rear surfaces of a semiconductor chip are held between two conductors having a pattern set at a position to establish connection with a front-surface terminal of the semiconductor chip.
2. The semiconductor chip has a thickness equal to or less than 110 microns.
3. The pattern is an antenna.
4. A semiconductor device where the front and rear surfaces of a semiconductor chip are held between two conductors having a pattern set at positions to establish connection with at least a surface terminal of the semiconductor chip, wherein the conductors are printed on a film substrate.
5. A semiconductor device where the front and rear surfaces of a semiconductor chip are held between two conductors, having a pattern, set at positions to establish connection with at least a surface terminal of the semiconductor chip, wherein the conductors are printed on a film substrate, and wherein the film substrate is stored in roll form.
6. A semiconductor device wherein, when front and rear surfaces of a semiconductor chip are held between two conductors having a pattern, which is set at a positions to establish connection with at least a surface terminal of the semiconductor chip, an anisotropic conductive adhesive is already attached to the surface of the semiconductor chip.

7. A semiconductor device wherein, before front and rear surfaces of semiconductor chip are held between two conductors having a pattern, set at positions to establish connection with at least a surface terminal of the semiconductor chip, an anisotropic conductive adhesive is already attached to the surface of the semiconductor chip, the anisotropic conductive adhesive having been attached to the semiconductor chip before the semiconductor chip was cut into a shape of semiconductor chip.

8. A semiconductor device where the front and rear surfaces of a semiconductor chip are held between two conductors having a pattern, set at positions to establish connection with at least a surface terminal of the semiconductor chip, wherein the conductors are printed on a film substrate, and wherein the film substrate is stored in a roll, further wherein the semiconductor chip and the conductors are cut out in use.

9. A semiconductor device where an electrode and an antenna are connected with each other by using conductive paste printed in an electrode portion by screen printing.

10. A semiconductor device where an oxide film is formed on the surface of an electrode, the electrode is connected with an antenna with conductive paste, and a capacitor between the antenna and the electrode is used as an input capacitor of a multiplying rectifier circuit.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described in detail with reference to the accompanying drawings.

First Embodiment

Figure 5:
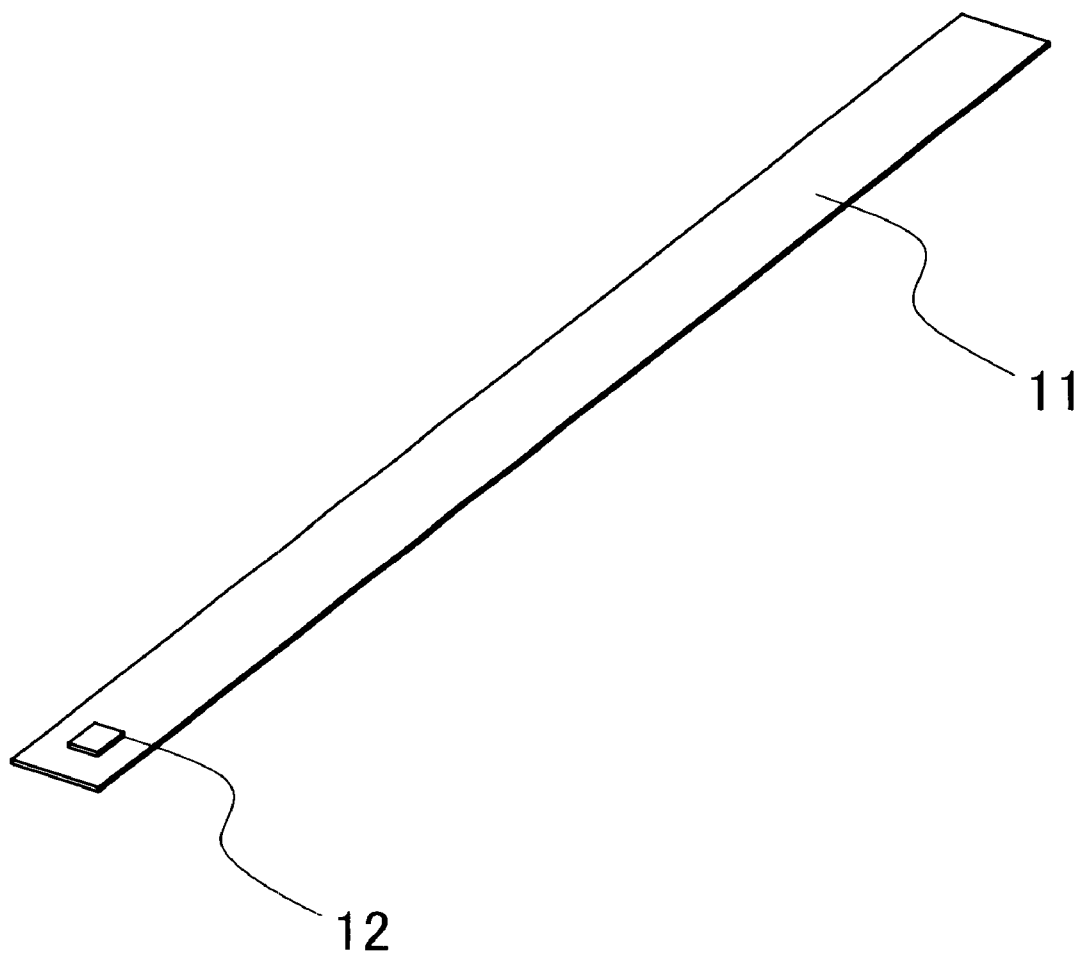
FIG. 5 is a perpective view of an antenna on which the identification chip is attached.

FIG. 5 shows an embodiment of the present invention. In FIG. 5, an antenna 11 is attached to a semiconductor chip, 12. The present invention relates to the construction of an identification device utilizing a thin semiconductor chip and its method of manufacture. The identification device is a device like a bar code from which digital information is readable and which can be repeatedly used. The identification device comprises a semiconductor chip which is capable of being read by non-contact reading from a reader. As long as the chip is thin, it can be attached to or incorporated in a thin sheet, such as paper.

The energy for operation of the semiconductor chip is provided by an electromagnetic wave radiated from the reader. The shape of the antenna differs in accordance with the frequency to be used. Even if the antenna is sufficiently small to be mounted on the chip, the antenna performs its function. In this case, the communication distance between the chip and the reader is short. In a case where the communication distance is longer (in a range where the communication is possible even if the chip and the reader are spaced away from each other), the size of the antenna must be increased. In this case, the antenna must be used as an off-chip antenna. One end of the off-chip antenna must be electrically connected with one terminal of the chip.

As the antenna, various types of antennas including a dipole antenna, a monopole antenna and a loop antenna can be considered. In a case where the semiconductor device is encapsulated in a sheet-type medium, the chip thickness is desirably equal to or less than 110 microns. Further, it is desirable that the antenna has a printed form or a thin wire form. The distortion-resistance of the device increases as the entire thickness decreases, however, metal reinforcement of metal evaporation is effective for the purpose of obtaining a resistance against a concentrated load. Further, a small chip size is economical and mechanical strength.

The antenna is formed by etching an evaporated film of metal, such as aluminum or nickel, or printing silver paste.

The printing is made by screen printing or the like on a PET substrate. The size of the antenna differs in accordance with the energy of the reader and/or communication distance. If the antenna has a comparatively large size and the energy is an integral fraction of the wavelength, it can communicate with a reader located 2 or 3 meters away from the antenna.

Second Embodiment

Figure 6:
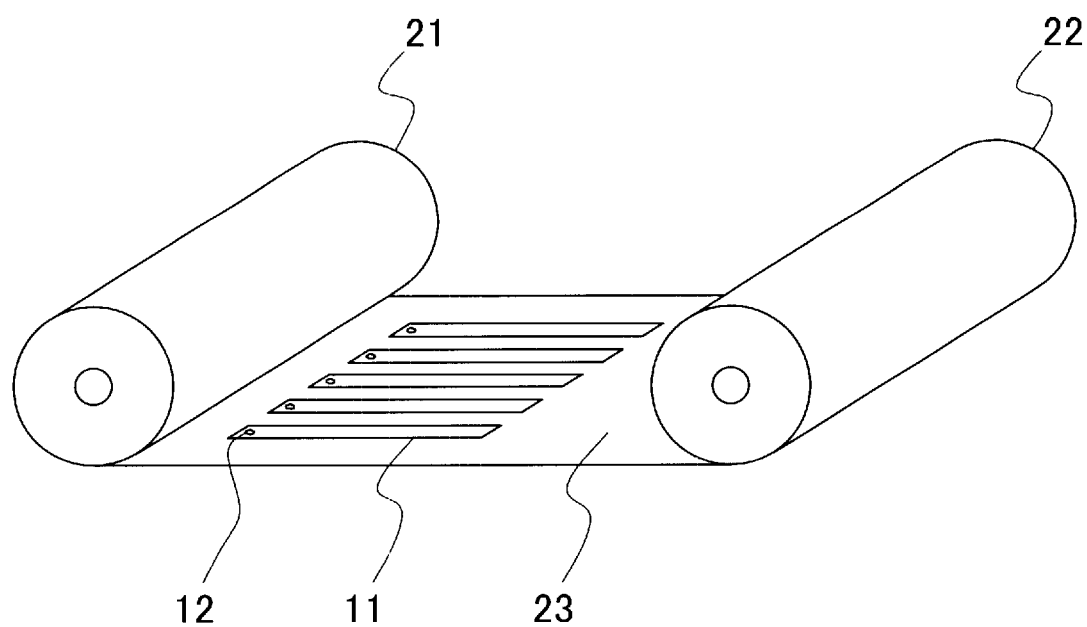
FIG. 6 is a perspective view of a rolled film substrate on which the identification chips with the antennas are mounted.

FIG. 6 shows another embodiment of the present invention. In this figure, an intermediate form of packaging, a so-called inlet, is shown. A thin film substrate 23 of PET or the like is rolled to form a first roll 21 and a second roll 22. The antennas 11 are formed on the thin film substrate 23 in advance by screen printing or etching. The thin chips are packaged and attached on the respective antennas, and they function as identification devices. Since the identification devices are thin when they are completed, they can be rolled, and upon shipment, they are delivered in the roll form.

The identification devices are used for various purposes in various fields. As the final forms of the identification devices in use are determined near places where the devices are to be used, it is convenient to deliver the devices in this intermediately completed status. If a single thin chip with an antenna is delivered, it might be damaged, and handling must be carefully made. Accordingly, it is preferable to deliver the identification devices in the roll status.

Various methods for mounting the antennas and chips can be available. The orientation of the antenna may be selected from vertical and horizontal orientations with respect to the roll. The film substrate may be provided on one chip surface, film substrates may hold the chip. The maximum value of the roll size can be freely determined. The minimum value of the roll size, e.g., a roll-up diameter, must be determined based on the thickness of the semiconductor chip.

Immediately after the antenna is mounted on the semiconductor chip, electrical and mechanical inspection of the identification device is performed by another device. Based on the result of inspection, a defective identification device is cut or marked. The interval between plural antennas can be freely determined.

The respective antennas may have various forms. For example, a proximity-type antenna and a remote-type antenna may be employed. Further, the semiconductor chips may have different shapes and functions. Reinforcement metal may be embedded in the film substrate in advance. Further, a chip handling unit and a film substrate transfer unit can be synchronized by the use of printing sprockets, register markers and the like on the film substrate.

Third Embodiment

Figure 7A:
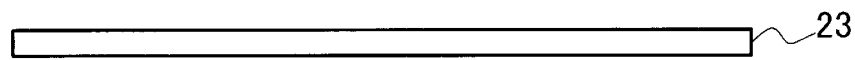
FIGS. 7A to 7F are cross-sectional views illustrating the handling of the film substrate on which the identification chip with the antenna is mounted.
Figure 7B:
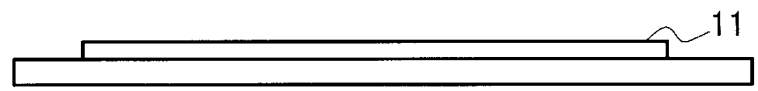
Figure 7C:
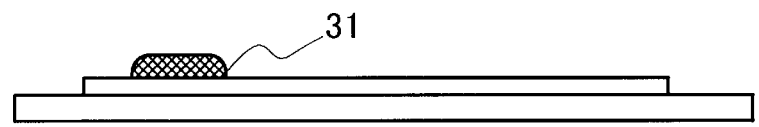
Figure 7D:
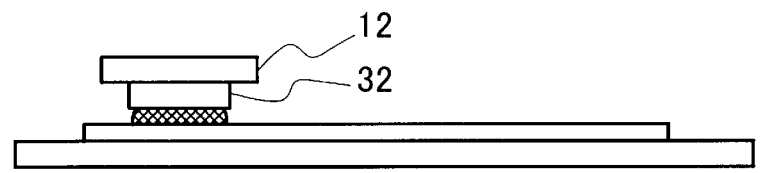
Figure 7E:
Figure 7F:
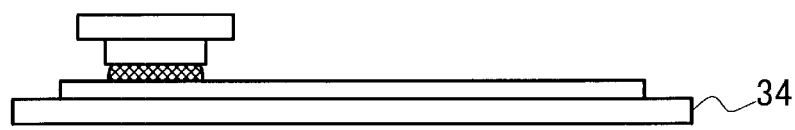

FIGS. 7A to 7F show another embodiment of the present invention. FIG. 7A is a cross-sectional view of the film substrate 23. FIG. 7B is a cross-sectional view of the substrate immediately after a process of printing the antenna 11 on the film substrate 23. More specifically, the film substrate 23 may have a thickness of 10 microns, and the antenna 11 may have a thickness of 10 microns. FIG. 7C is a cross-sectional view of the substrate immediately after a process of applying adhesive 31 to the antenna 11. FIG. 7D is a cross-sectional view of the substrate in which the semiconductor chip 12 having a surface electrode 32 is aligned face down relative to the film substrate 23 and is mounted. FIG. 7E is a cross-sectional view of the substrate showing a process of cutting out the antenna 11 and the semiconductor chip 12 by cutting the substrate with cutters 33 to a predetermined size. FIG. 7F is a cross-sectional view of the cut out identification device, called an inlet.

Upon shipment, the inlet is attached to various products, media such as paper and film. In the form of an inlet, the inconvenience in case of direct shipment of a thin and small semiconductor chip can be avoided. Further, as inspection can be performed on the chip with the antenna, the electrical and mechanical quality can be easily ensured. Further, a process of separating the chip from the inlet by cutting and attaching or incorporating it in a final object can be delayed to the point of final packaging until the final packaging, the chip can be easily handled in the form of an inlet. Further, if the antenna has a small shape and a transparent color, it can increase its stealth characteristics even it is encapsulated in a medium. This improves utility values in terms of security, usage and design.

Fourth Embodiment

Figure 8A:
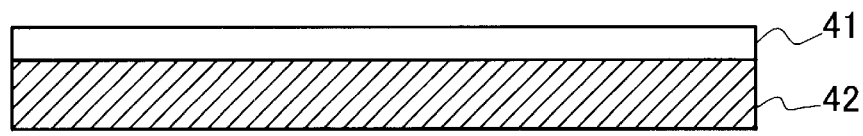
FIGS. 8A to 8C are cross-sectional views illustrating a process of forming a surface device 41 and an adhesive layer 43 on the surface of silicon substrate 42 and forming separation grooves 44 in the adhesive layer 43.
Figure 8B:
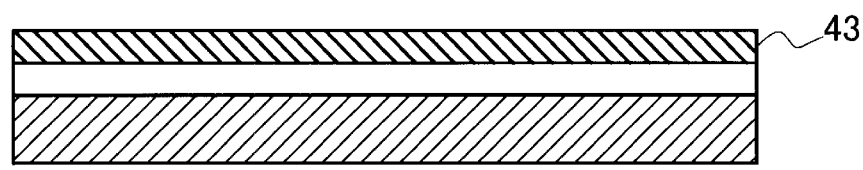
Figure 8C:
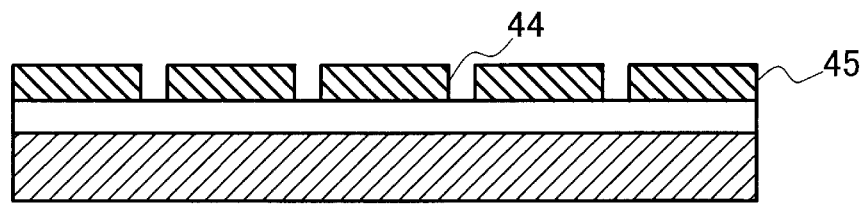

FIGS. 8A to 8C show another embodiment of the present invention. FIG. 8A is a cross-sectional view of a semiconductor wafer having a surface device 41 and a silicon substrate 42. FIG. 8B is a cross-sectional view of the wafer immediately after a process of applying anisotropic conductive adhesive to a wafer surface 43. FIG. BC is a cross-sectional view of the wafer immediately after a process of forming separate grooves 44 in the adhesive 45. The separate grooves 44 are formed along separation lines of the semiconductor chips. If the semiconductor wafer is especially a silicon-on-insulator wafer, the semiconductor wafer can be self-consistently thinned, therefore, it can be uniformly thinned. The anisotropic conductive adhesive may be a sheet type adhesive to be attached to the wafer, or the adhesive may be applied to the wafer by spin coating, cast-pouring or transfer molding. The grooves are formed by wet etching or dry etching. In the case of dry etching, a method which reduces side etching is preferable in the formation of grooves in correspondence with the size of the thin semiconductor chip, and the method can increase the economic viability with a reduced groove width. In this case, resin is separated by etching, however the adhesive can be printed on the wafer by screen printing.

Fifth Embodiment

Figure 9A:
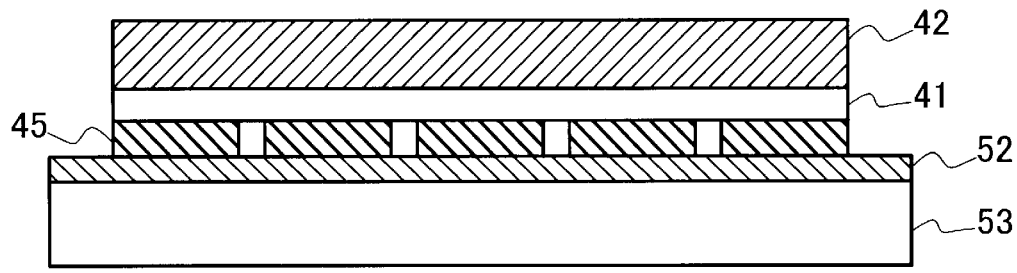
FIGS. 9A to 9C are cross-sectional views illustrating a process of attaching the substrate 42 in FIG. 8C, faced down, onto a tape 53, and further processing the substrate.
Figure 9B:
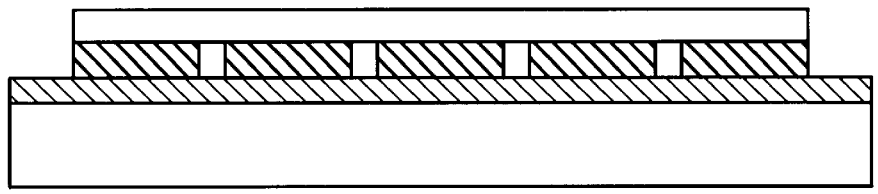
Figure 9C:
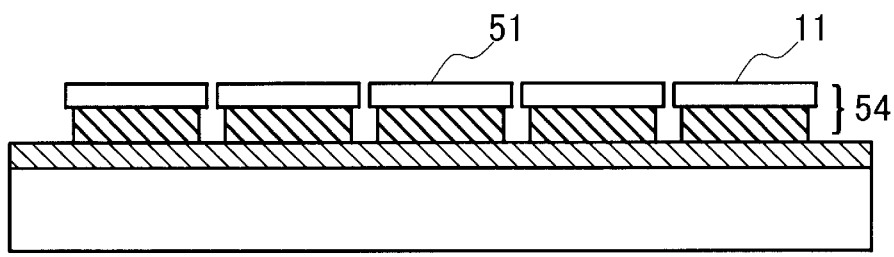

FIGS. 9A to 9C show another embodiment of the present invention. FIG. 9A is a cross-sectional view of the tape 53 on which a wafer, having the surface device 41 formed on the silicon substrate 42 and an adhesive layer 45 divided into several adhesive portions, is attached face down. FIG. 9B is a cross-sectional view of the tape immediately after a process of removing the silicon substrate 42. FIG. 9C is a cross-sectional view of the tape showing that surface device separate grooves 51 are formed in the surface device 41, thus dividing the surface device into semiconductor chips 54. The silicon substrate is etched by a silicon etchant, such as potassium hydroxide, hydrazine or ammonia. As long as the wafer is a silicon-on-insulator wafer, the etching can be stopped by use of an etching stopper, the silicon oxide film as an internal layer. Thus, the wafer can be uniformly thinned without the need for an expensive device. The surface device separate grooves 51 are formed by applying photoresist on the rear surface of the surface device 41, exposure-developing the device using the photoresist as a mask, thereby forming windows, and performing dry etching or, wet etching. Among dry etching methods, if an etching method with an especially high aspect ratio is selected, the groove width can be small, and the number of semiconductor chips can be increased, thus the economic viability can be improved.

Sixth Embodiment

Figure 10:
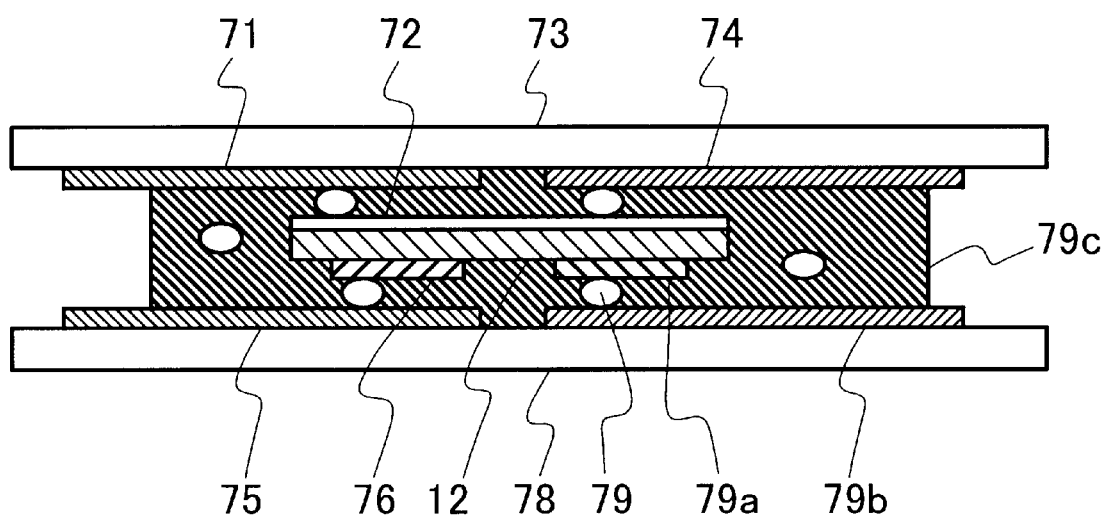
FIG. 10 is a cross-sectional view illustrating a process of fixing an identification chip between antennas positioned above and below the chip, according to another embodiment of the present invention.

FIG. 10 shows another embodiment of the present invention. This figure is a cross-sectional view of a semiconductor chip held between two substrates. An upper first electrode 71 is prevented from a short circuit by a chip rear-surface oxide film 72, and an upper second electrode 74 provided on an upper sheet 73 is also prevented from a short circuit. A lower first electrode is connected with a chip first electrode 76. The chip 12 is connected with electrode on a lower sheet 78 via conductive particles 79. A chip second electrode 79a and a lower second electrode 79b are connected with each other also via the conductive particle 79. The conductive particles 79 are dispersed in adhesive resin 79c. Here, emphasis is put on the embodiment using a thin chip, however, similar handling can be effected in the use of a conventional thick chip equal to or greater than 100 microns. In such case, the economic viability can be ensured by batch-style assembling by handling the chip as a single member.

Figure 4A:
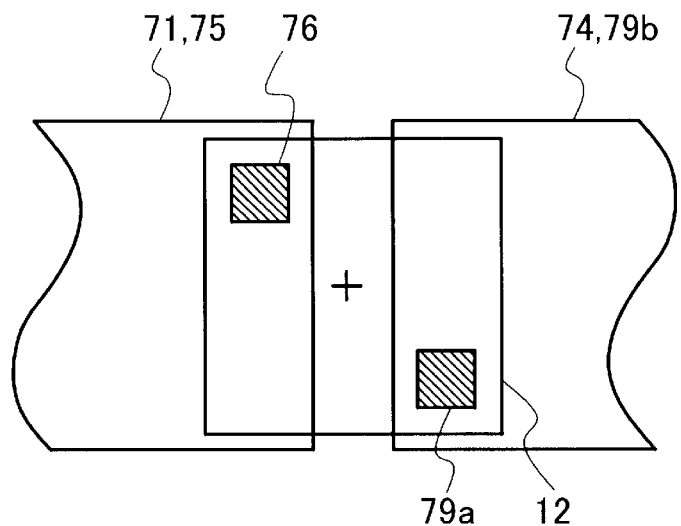
FIGS. 4A and 4B are schematic top views illustrating another alignment between the identification chip and the antennas according to another embodiment of the present invention.
Figure 4B:
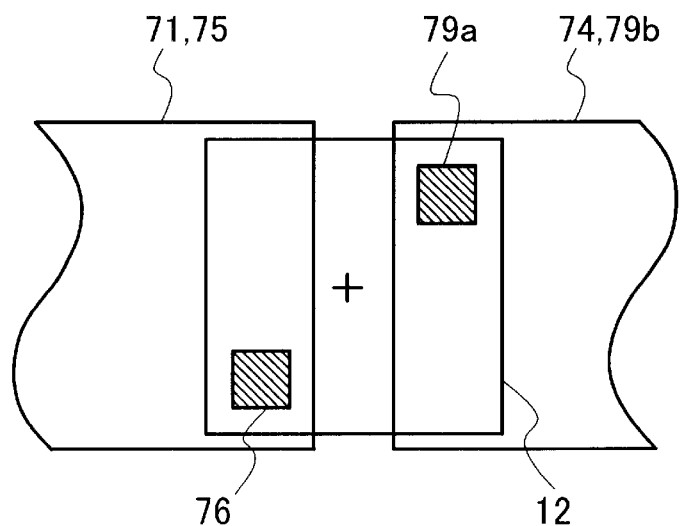

Note that, since the formation of the chip rear-surface oxide film 72 is not necessary, the film can be omitted. FIGS. 4A and 4B show an embodiment where antenna electrodes and chip electrodes are connected with each other even when the chip is rotated 90°. The semiconductor chip 12 in FIG. 4A and the semiconductor chip 12 in FIG. 4B are rotated by 90° relative to each other. Since a chip first electrode 76 and a chip second electrode 79a are symmetrically positioned, the chip electrodes can be connected with the antenna electrodes even if the chip is rotated 90°.

In this case, where the antennas are provided in upper and lower positions, if one of the antennas is used as a ground, a distributed constant circuit is formed and energy and a signal can be transmitted effectively. This is possible in a high frequency band of 2.45 GHz by use of capacitor coupling. Further, in a low frequency band of 13.56 MHz, as the wavelength is long for the antenna, little side effect is produced on the resonance efficiency.

Seventh Embodiment

Figure 11:
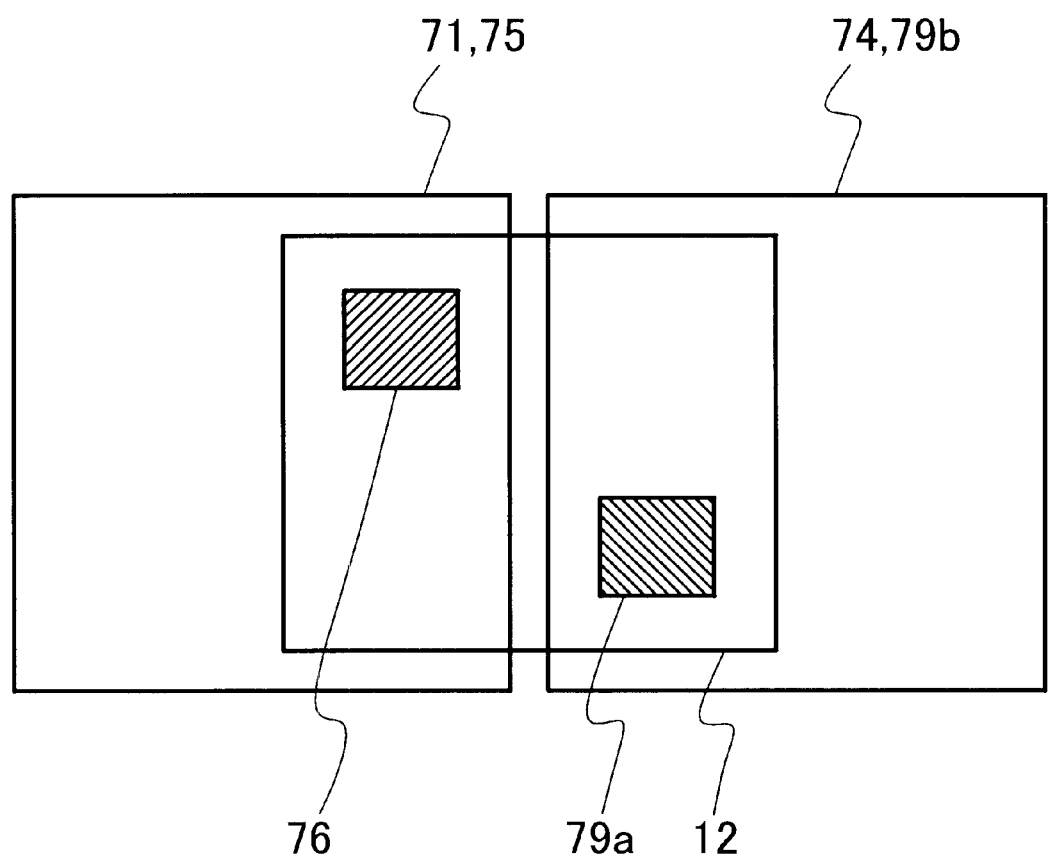
FIG. 11 is a schematic top view showing a pair of antennas attached to a pair of electrodes of one identification chip, according to another embodiment of the present invention.

FIG. 11 shows another embodiment of the present invention. The figure is a plan view of the device shown in FIG. 10. In FIG. 11, an upper first electrode 71 and a lower first electrode 75 are overlapped with each other, and, similarly, an upper second electrode 74 and a lower second electrode 79b are overlapped with each other. The upper first electrode 71 and the upper second electrode 74, the lower first electrode 75 and the lower second electrode 79b, and the chip first electrode 76 and the chip second electrode 79a on the chip 12 are respectively formed symmetrically. The electrodes on the chip and the electrodes on the substrate are arranged such that at least electrical connection can be established between the chip and the substrate electrodes even if the chip is turned over or rotated. The antenna on the chip is provided such that the circuit on the chip operates even if the antenna has an opposite polarity. The antenna can be mounted on any of the rear and front surfaces of the chip. Further, even if the chip is rotated 90° and aligned, the antenna can be mounted on the chip. Accordingly, the mounting method of the present embodiment is appropriate for mass production. FIGS. 4A and 4B show the embodiment where antenna electrodes and chip electrodes are connected with each other even when the chip is rotated 90°. The semiconductor chip 12 in FIG. 4A and the semiconductor chip 12 in FIG. 4B are rotated 90° relative to each other. Since the chip first electrode 76 and the chip second electrode 79a are symmetrically positioned, the chip electrodes can be connected with the antenna electrodes even if the chip is rotated 90°.

Eighth Embodiment

Figure 12A:
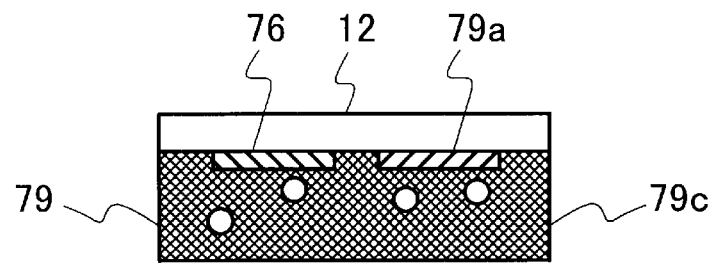
FIGS. 12A and 12B are cross-sectional views showing a construction where antennas are positioned above and below one identification chip and conductive particles are provided on electrodes of the identification chip, according to another embodiment of the present invention.
Figure 12B:
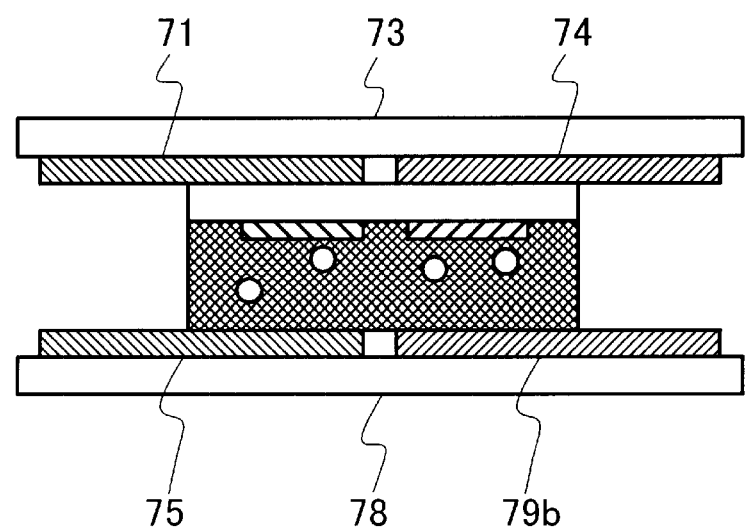

FIGS. 12A and 12B show another embodiment of the present invention. FIG. 12A is a cross-sectional view of the thin chip 12, to which the adhesive resin 79c is attached, thus having enhanced strength. The chip first electrode 76 and the chip second electrode 79a are provided on the surface of the thin chip 12. Further, the conductive particles 79 are dispersed in the adhesive resin 79c. The adhesive resin is a thermoplastic or thermosetting resin. FIG. 12B shows a cross-sectional view of the chip in FIG. 12A held between two film substrates. The electrodes on the upper and lower film substrates and the electrodes on the chip are aligned with each other. In this state, when the adhesive resin is melted and hardened by heating and application of pressure, the electrodes are connected with the electrodes on the lower substrate as shown in the cross-sectional view of FIG. 10B. Since the thin chip is attached to the adhesive resin in advance, the strength can be ensured. Thus, it is possible to handle the plural chips collectively instead of separately handling the chips. Further, the alignment with the substrate can be effected regardless of the chip front/rear surface and rotation. Thus, the mounting apparatus can be simplified and economical manufacturing can be realized.

Ninth Embodiment

Figure 13:
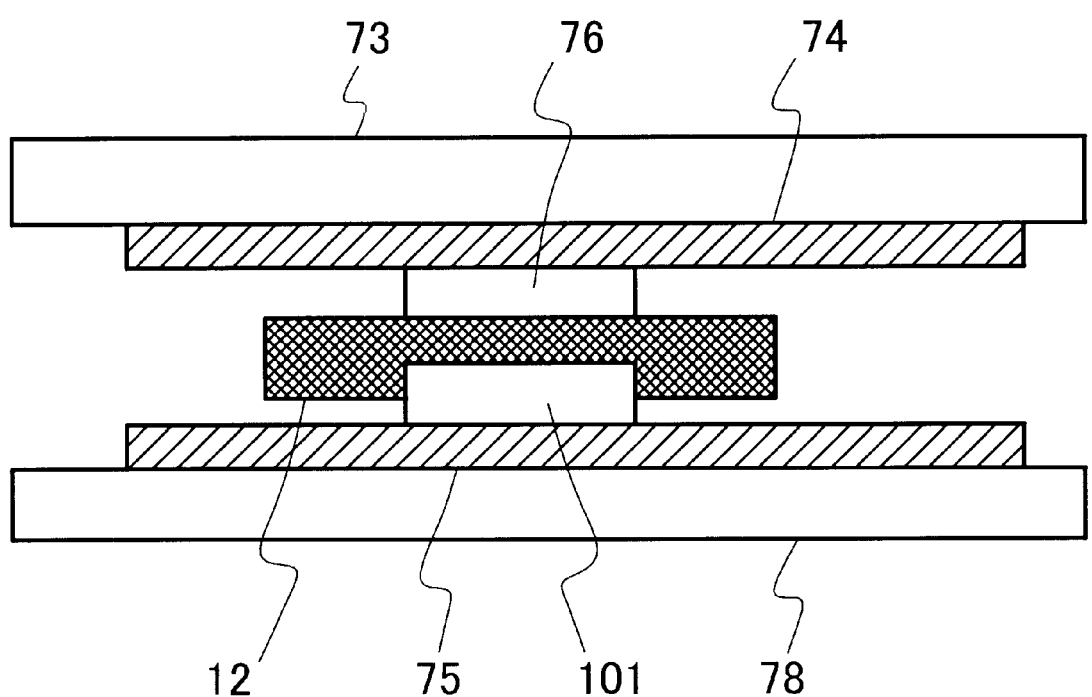
FIG. 13 is a cross-sectional view showing a modification to the construction shown in FIG. 12B, according to another embodiment of the present invention.

FIG. 13 shows another embodiment of the present invention. In FIG. 13, the elements corresponding to those described above have the same reference numerals, and a respect of the explanations of these elements will be omitted. This figure further shows a rear surface electrode 101 connected with the antenna from the chip rear surface. Even if the chip turned over, the electrode can be connected with the antenna.

Tenth Embodiment

Figure 14A:
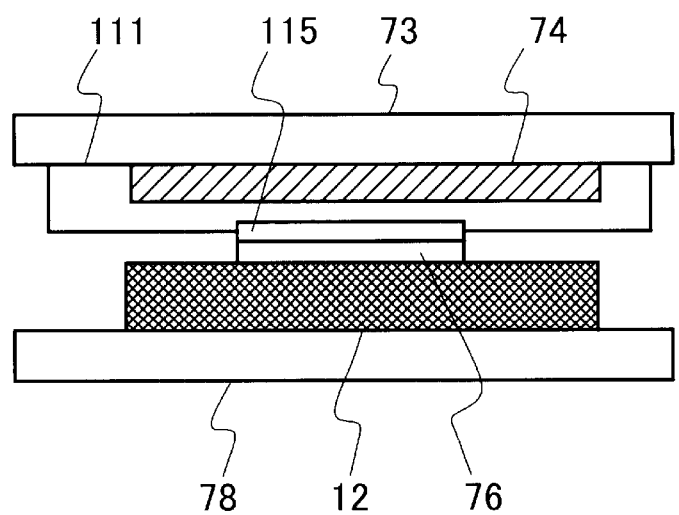
FIG. 14A is a cross-sectional view showing a modification to the construction in FIG. 12B, according to another embodiment of the present invention.
Figure 14B:
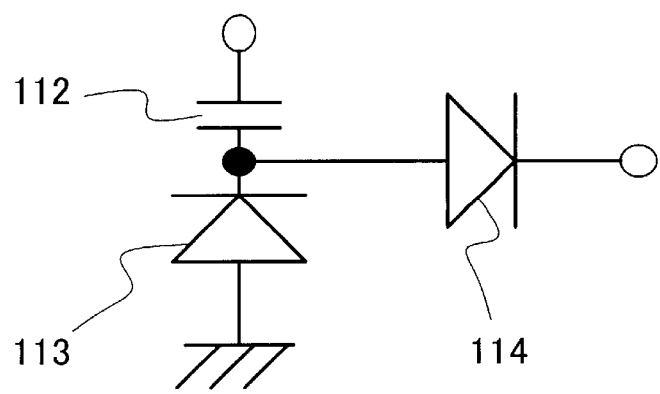
FIG. 14B is a schematic diagram of the modified embodiment of FIG. 14A.

FIGS. 14A and 14B relate to another embodiment of the present invention. These figures show a part of the electrodes. In FIG. 14A, an oxide film 115 is formed on the electrode 76 and is attached to the antenna 74 by adhesive 111. FIG. 14B shows a front end circuit in the chip. A capacitor 112 is formed between the electrodes in FIG. 14A and the antenna. A double voltage rectified by a rectifier diode 113 and an input diode 114 occurs at an output.

Eleventh Embodiment

Figure 3A:
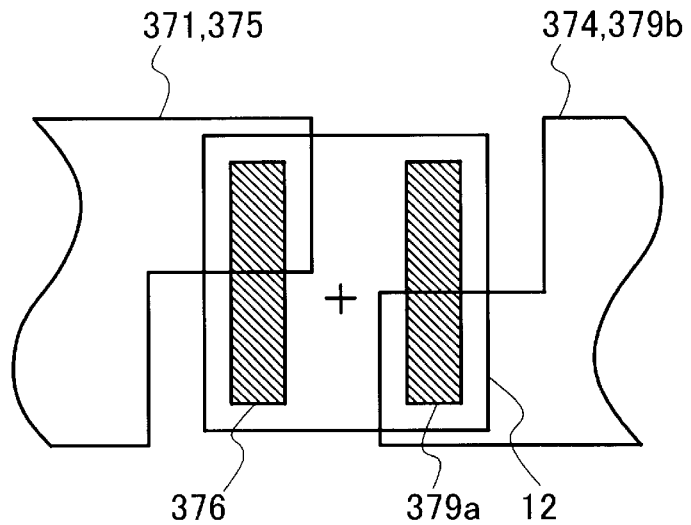
FIGS. 3A and 3B are schematic top views illustrating alignment between the identification chip and antennas according to another embodiment of the present invention.
Figure 3B:
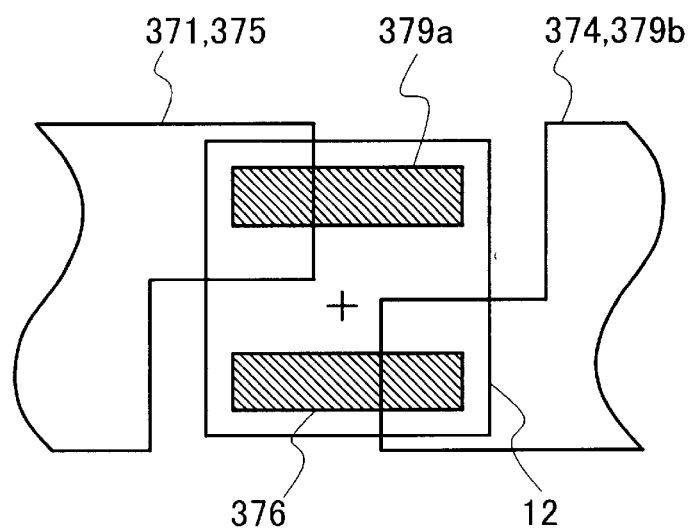

FIGS. 3A and 3B show another embodiment of the present invention. In these figures, an upper first electrode 371 and a lower first electrode 375 are overlapped with each other, and, similarly, an upper second electrode 374 and a lower second electrode 379b are overlapped with each other. The upper first electrode 371 and the upper second electrode 374, the lower first electrode 375 and the lower second electrode 379b, and a chip first electrode 376 and a chip second electrode 379a on the chip 12 are formed symmetrically. The electrodes on the chip and the electrodes on the substrate are arranged such that at least connection with the substrate electrodes can be ensured even if the chip is turned over or rotated. The antennas on the chip are set such that the circuit on the chip operates even if the polarity is opposite. The antennas can be mounted without setting the position of the semiconductor chip. That is, as the electrodes on the substrate are provided in upper and lower positions, connection can be made regardless of the front/rear surface of the chip. This is appropriate for mass-production. Further, since connection can be made even if the chip is rotated, connection can be realized without aligning the chip. Further, FIGS. 3A and 3B show an embodiment where antenna electrodes and chip electrodes are connected with each other even when the chip is rotated 90°. The semiconductor chip 12 in FIG. 3A and the semiconductor chip 12 in FIG. 3B are rotated 90° relative to each other. Since the chip first electrode 376 and the chip second electrode 379a are symmetrically positioned the chip electrodes can be connected with the antenna electrodes even if the chip is rotated 90°.

Twelfth Embodiment

Figure 1A:
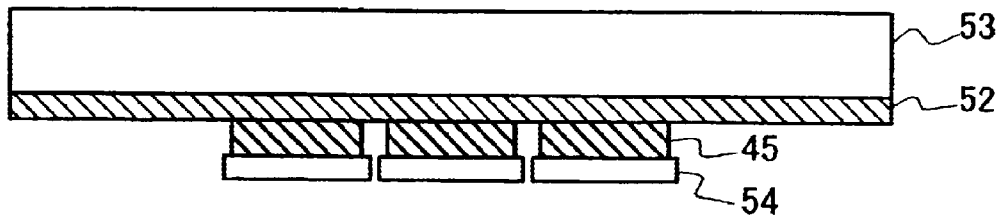
FIGS. 1A to 1D are cross-sectional views illustrating the conventional method for packaging identification chips.
Figure 1B:
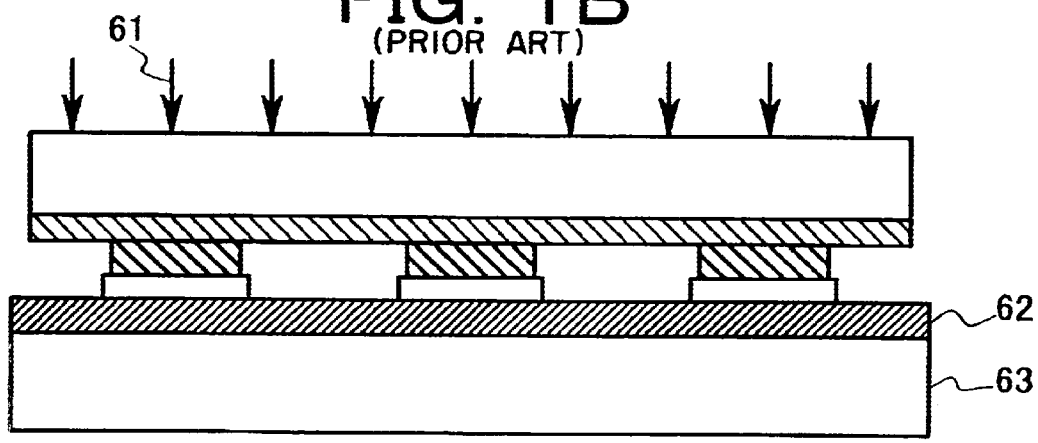
Figure 1C:
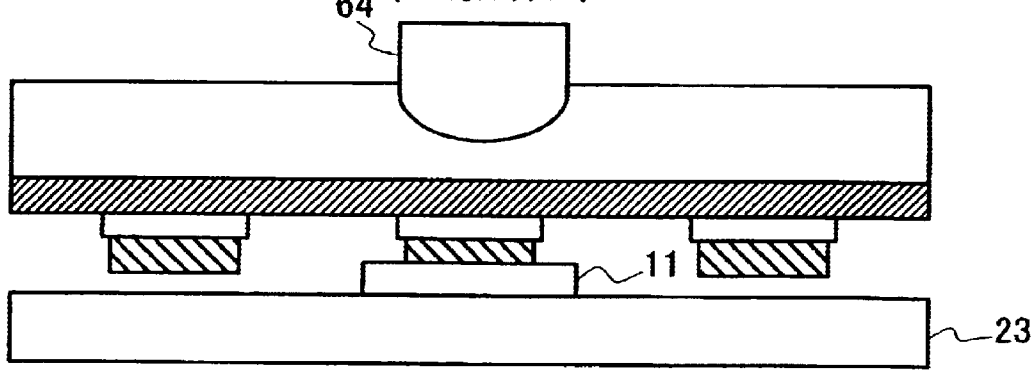
Figure 1D:
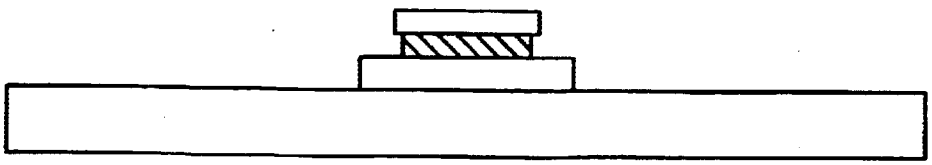
Figure 2A:
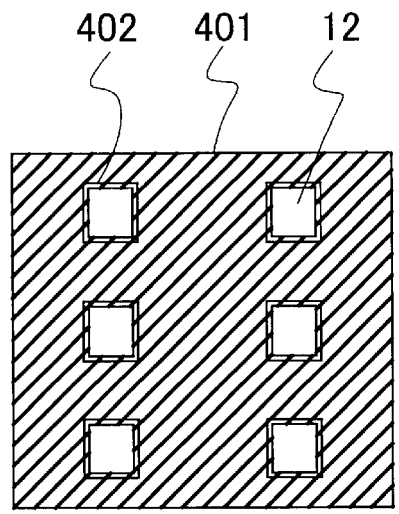
FIGS. 2A and 2B are schematic top views illustrating the attachment of antennas to identification chips aligned by an identification-chip alignment jig according to an embodiment of the present invention.
Figure 2B:
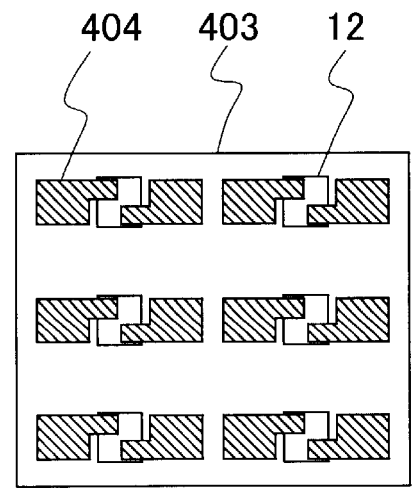

FIGS. 2A and 2B (top views) show another embodiment of the present invention. The alignment jig 401 has plural (2 to about 100,000) grooves 402. Each semiconductor chip 12 is set in each groove by ultrasonic-like vibration. The semiconductor chips set in the alignment jig are transferred onto the film substrate 403, having antenna patterns 404, and are collectively connected with the antennas. In this manner, in comparison with a case where chips are separately aligned, connection can be made simultaneously between the antenna patterns and the semiconductor chips, thus the assembly cost can be remarkably reduced. The present invention is not limited to the above embodiments and various changes and modifications can be made within the spirit and scope of the present invention. Therefore, to appraise the public of the scope of the present invention, the following claims are made.

What is claimed is:

1. A semiconductor device wherein establishment of electrical connection is provided between one electrode terminal of a semiconductor chip having an approximately rectangular or square plane shape and a first conductor member of a film substrate, by aligning said first conductor member with said one electrode terminal, wherein said one electrode terminal is one of a pair of electrode terminals formed on a major surface of the semiconductor chip, wherein electrical connection can be made in a case where said semiconductor chip is rotated 90° in a plane direction corresponding to the major surface of said semiconductor chip, and in a case where said semiconductor chip is not rotated in said plane direction, and wherein said semiconductor chip and said first conductor member are electrically connected with each other through said one electrode terminal such that said first conductor member is substantially parallel to said major surface of said semiconductor chip and to said pair of electrode terminals, wherein a portion of said first conductor member near a connection portion with said one electrode terminal has a shape connectable with one of said pair of electrode terminals but unconnectable with the other one of said pair of electrode terminals.

2. A semiconductor device wherein establishment of electrical connection is provided between one electrode terminal of a semiconductor chip having an approximately rectangular or square plane shape and a first conductor member of a film substrate, by aligning said first conductor member with said one electrode terminal, wherein said one electrode terminal is one of a pair of electrode terminals formed on a major surface of the semiconductor chip, wherein electrical connection can be made in a case where said semiconductor chip is rotated 90° in a plane direction corresponding to the major surface of said semiconductor chip, and in a case where said semiconductor chip is not rotated in said plane direction, and wherein said semiconductor chip and said first conductor member are electrically connected with each other through said one electrode terminal such that said first conductor member is substantially parallel to said major surface of said semiconductor chip and to said pair of electrode terminals, wherein said semiconductor chip comprises a thin identification chip, and wherein said first conductor member is an antenna electrically connected to said thin identification chip through said one electrode terminal.

3. A semiconductor device according to claim 2, wherein said semiconductor chip has a thickness equal to or less than 110 microns.

4. A semiconductor device comprising:
   a thin semiconductor chip having a pair of major surfaces opposite and substantially parallel to one another;
   a pair of electrode terminals formed on one of said major surfaces; and
   a first conductor member aligned with and electrically connected to one of said pair of electrode terminals such that said first conductor member is substantially parallel to said one of said major surfaces and to said one of said pair of electrode terminals,
   wherein said pair of electrode terminals are formed on said one of said major surfaces of said thin semiconductor chip such that electrical connection can be made between said first conductor member and one of said electrode terminals regardless of whether said semiconductor chip is rotated 90° in a plane direction corresponding to said one of said major surfaces of said semiconductor chip in which the pair of electrode terminals are formed or is not rotated in said plane direction, wherein said semiconductor chip comprises a thin identification chip, and wherein said first conductor member is an antenna electrically connected to said thin identification chip through said one electrode terminal.

5. A semiconductor device according to claim 4 wherein said semiconductor chip has a thickness equal to or less than 110 microns.

6. A semiconductor device comprising:
   a thin semiconductor chip having a pair of major surfaces opposite and substantially parallel to one another;
   a pair of electrode terminals formed on one of said major surfaces; and
   a first conductor member aligned with and electrically connected to one of said pair of electrode terminals such that said first conductor member is substantially parallel to said one of said major surfaces and to said one of said pair of electrode terminals,
   wherein said pair of electrode terminals are formed on said one of said major surfaces of said thin semiconductor chip such that electrical connection can be made between said first conductor member and one of said electrode terminals regardless of whether said semiconductor chip is rotated 90° in a plane direction corresponding to said one of said major surfaces of said semiconductor chip in which the pair of electrode terminals are formed or is not rotated in said plane direction, wherein said semiconductor chip has a thickness equal to or less than 110 microns.

7. A semiconductor device comprising:
   a thin semiconductor chip having a pair of major surfaces opposite and substantially parallel to one another;
   a pair of electrode terminals formed on one of said major surfaces; and
   a first conductor member aligned with and electrically connected to one of said pair of electrode terminals such that said first conductor member is substantially parallel to said one of said major surfaces and to said one of said pair of electrode terminals, wherein said pair of electrode terminals are formed on said one of said major surfaces of said thin semiconductor chip such that electrical connection can be made between said first conductor member and one of said electrode terminals regardless of whether said semiconductor chip is rotated 90° in a plane direction corresponding to said one of said major surfaces of said semiconductor chip in which the pair of electrode terminals are formed or is not rotated in said plane direction, wherein a portion of said first conductor member near a connection portion with said one electrode terminal has a shape connectable with one of said pair of electrode terminals but unconnectable with the other one of said pair of electrode terminals.

* * * * *